United States Patent
Fang et al.

(10) Patent No.: US 7,268,605 B2
(45) Date of Patent: Sep. 11, 2007

(54) TECHNIQUE FOR OPERATING A DELAY CIRCUIT

(75) Inventors: Wayne Fang, Pleasanton, CA (US); Wayne S. Richardson, Saratoga, CA (US); Anthony Wong, Daly City, CA (US)

(73) Assignee: Rambus, Inc., Los Altos, CA (US)

( * ) Notice: Subject to any disclaimer, the term of this patent is extended or adjusted under 35 U.S.C. 154(b) by 22 days.

(21) Appl. No.: 10/865,780

(22) Filed: Jun. 14, 2004

(65) Prior Publication Data

US 2005/0275440 A1    Dec. 15, 2005

(51) Int. Cl.
*H03H 11/26* (2006.01)
(52) U.S. Cl. ............... 327/261; 327/269; 327/295
(58) Field of Classification Search ............ None
See application file for complete search history.

(56) References Cited

U.S. PATENT DOCUMENTS

| | | | | |
|---|---|---|---|---|
| 5,150,364 A | * | 9/1992 | Negus | 370/542 |
| 5,313,154 A | * | 5/1994 | Norris | 324/76.48 |
| 5,483,540 A | * | 1/1996 | Okamura | 370/542 |
| 5,742,798 A | | 4/1998 | Goldrian | 395/551 |
| 5,801,567 A | * | 9/1998 | Kosiec | 327/263 |
| 6,072,336 A | * | 6/2000 | Yamaguchi | 327/12 |
| 6,127,864 A | * | 10/2000 | Mavis et al. | 327/144 |
| 6,175,603 B1 | * | 1/2001 | Chapman et al. | 375/354 |
| 6,313,708 B1 | * | 11/2001 | Beaulieu | 331/17 |
| 6,459,313 B1 | * | 10/2002 | Godbee et al. | 327/161 |
| 6,819,153 B2 | * | 11/2004 | Sonobe | 327/158 |
| 6,864,722 B2 | * | 3/2005 | Adkisson | 327/12 |

FOREIGN PATENT DOCUMENTS

JP    2000035831 A    2/2000

* cited by examiner

*Primary Examiner*—Kenneth B. Wells
*Assistant Examiner*—An T. Luu
(74) *Attorney, Agent, or Firm*—Hunton & Williams LLP

(57) ABSTRACT

A technique for operating a delay circuit is disclosed. In one particular exemplary embodiment, the technique may be realized by a delay circuit comprising a plurality of data paths. The delay circuit may receive a signal. The delay circuit may also stagger transmissions of the signal through the plurality of data paths. The delay circuit may additionally generate a plurality of signals based on the staggered transmissions. Each of the plurality of data paths in the delay circuit may comprise at least one of an inverter, a logic gate, a flip-flop, a latch, a register, or a resistor-capacitor (RC) delay element.

22 Claims, 5 Drawing Sheets

TECHNIQUE FOR OPERATING A DELAY CIRCUIT

FIELD OF THE DISCLOSURE

The present disclosure relates generally to electronic circuits and, more particularly, to a technique for operating a delay circuit to reduce inductive noise.

BACKGROUND OF THE DISCLOSURE

It is well known that an inductor typically resists a change in the current flowing through it by generating a counteracting voltage drop. This phenomenon can be troublesome for electronic circuits that accommodate fast-switching operations. Rapidly changing currents can induce voltage fluctuations (i.e., inductive noise) in parasitic inductors that are inherent in most circuits. For example, a memory array employing a differential bi-directional bus may have inductive noise problems. During a bus-turnaround between READ and WRITE operations, current ramp profiles on the memory array's power supply rails can induce large voltage fluctuations as well as ground bounce. Such inductive noise problems can be exacerbated when a memory chip is packaged with inexpensive materials with large associated parasitic inductances. Typically, in a dynamic random access memory (DRAM), the input/output (I/O) subsystem contributes the most to the current ramp profile on the power rails.

In FIG. 1, there are shown two sets of current profiles and voltage fluctuation waveforms in an output subsystem of a DRAM. As can be seen, a relatively slow current ramp (102) causes a moderate voltage fluctuation (104) on the power rail. If the current ramps up faster (106), larger voltage spikes (108) can be induced on the power rail, which may impact the behavior of the internal circuits.

Most existing solutions to inductive noise problems focus on design, layout or packaging techniques of the affected integrated circuits. One common approach is to separate the power pins for a chip's core circuits and its I/O drivers. Another approach involves restricting the number of I/O drivers connected to a single supply pin. Selection of the position of power and ground pins on the package can also affect inductive noise. However, these solutions are typically useful only to the specific circuits for which they are designed. A slightly different circuit may require a complete different solution. There has not been a system-level solution that can reduce the effect of inductive noise regardless of the underlying physical circuits.

In view of the foregoing, it would be desirable to provide a solution for reducing inductive noise which overcomes the above-described inadequacies and shortcomings.

SUMMARY OF THE DISCLOSURE

A technique for operating a delay circuit is disclosed. In one particular exemplary embodiment, the technique may be realized as a method for operating a delay circuit. The method may comprise receiving a signal. The method may also comprise staggering transmissions of the signal through a plurality of data paths in a delay circuit. The method may additionally comprise generating a plurality of signals based on the staggered transmissions of the signal.

In accordance with other aspects of this particular exemplary embodiment, each of the plurality of data paths in the delay circuit may comprise at least one of an inverter, a logic gate, a flip-flop, a latch, a register, or a resistor-capacitor (RC) delay element.

In accordance with further aspects of this particular exemplary embodiment, at least part of the delay circuit may be controlled by a plurality of clock signals. The plurality of clock signals may have a common frequency but have different predefined phase angles. Specifically, the plurality of clock signals may comprise quadrature clock signals. And the quadrature clock signals may be generated based on an initial clock signal having a lower frequency than the common frequency.

In accordance with additional aspects of this particular exemplary embodiment, the signal may comprise a digital control signal associated with a memory device. The plurality of signals may be control signals associated with an input/output subsystem of the memory device.

In another particular exemplary embodiment, the technique may be realized by at least one signal embodied in at least one carrier wave for transmitting a computer program of instructions configured to be readable by at least one processor for instructing the at least one processor to execute a computer process for performing the method as recited above.

In yet another particular exemplary embodiment, the technique may be realized by at least one processor readable carrier for storing a computer program of instructions configured to be readable by at least one processor for instructing the at least one processor to execute a computer process for performing the method as recited above.

In still another particular exemplary embodiment, the technique may be realized by a delay circuit comprising a plurality of data paths. The delay circuit may receive a signal. The delay circuit may also stagger transmissions of the signal through the plurality of data paths. And the delay circuit may additionally generate a plurality of signals based on the staggered transmissions of the signal.

In accordance with other aspects of this particular exemplary embodiment, each of the plurality of data paths in the delay circuit may comprise at least one of an inverter, a logic gate, a flip-flop, a latch, a register, or a resistor-capacitor (RC) delay element.

In accordance with further aspects of this particular exemplary embodiment, at least part of the delay circuit may be controlled by a plurality of clock signals. The plurality of clock signals may share a common frequency but have different predefined phase angles. Specifically, the plurality of clock signals may comprise quadrature clock signals. And the quadrature clock signals may be generated based on an initial clock signal having a lower frequency than the common frequency.

In accordance with additional aspects of this particular exemplary embodiment, the signal may comprise a digital control signal associated with a memory device. The plurality of signals may be control signals associated with an input/output subsystem of the memory device.

In a further particular exemplary embodiment, the technique may be realized by a system for reducing inductive noise. The system may comprise means for receiving a signal. The system may also comprise means for staggering transmissions of at least two substantially concurrent signals through a plurality of data paths in the delay circuit. The system may additionally comprise means for generating a plurality of signals based on the staggered transmissions of the signal.

In a yet further particular exemplary embodiment, the technique may be realized by a system for reducing inductive noise. The system may comprise a clock generator that generates a plurality of clock signals. The system may also comprise a delay circuit comprising a plurality of data paths controlled by the plurality of clock signals. The delay circuit may stagger transmissions of a signal through the plurality of data paths. The delay circuit may also generate a plurality of signals based on the staggered transmissions of the signal.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure could be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENT(S)

Figure 1:
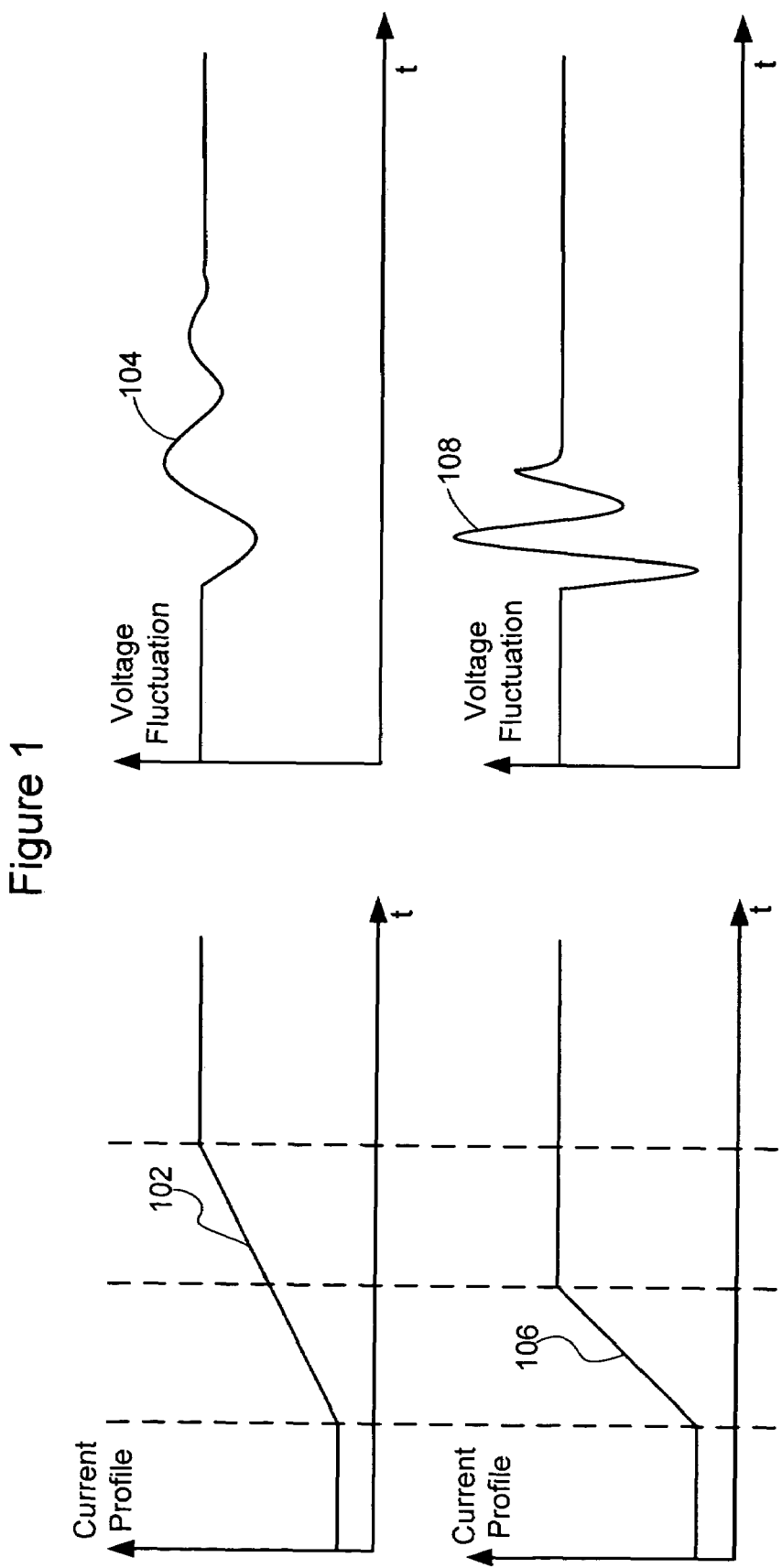
FIG. 1 is an illustration of the effects of current profiles on inductive noise.
Figure 2:
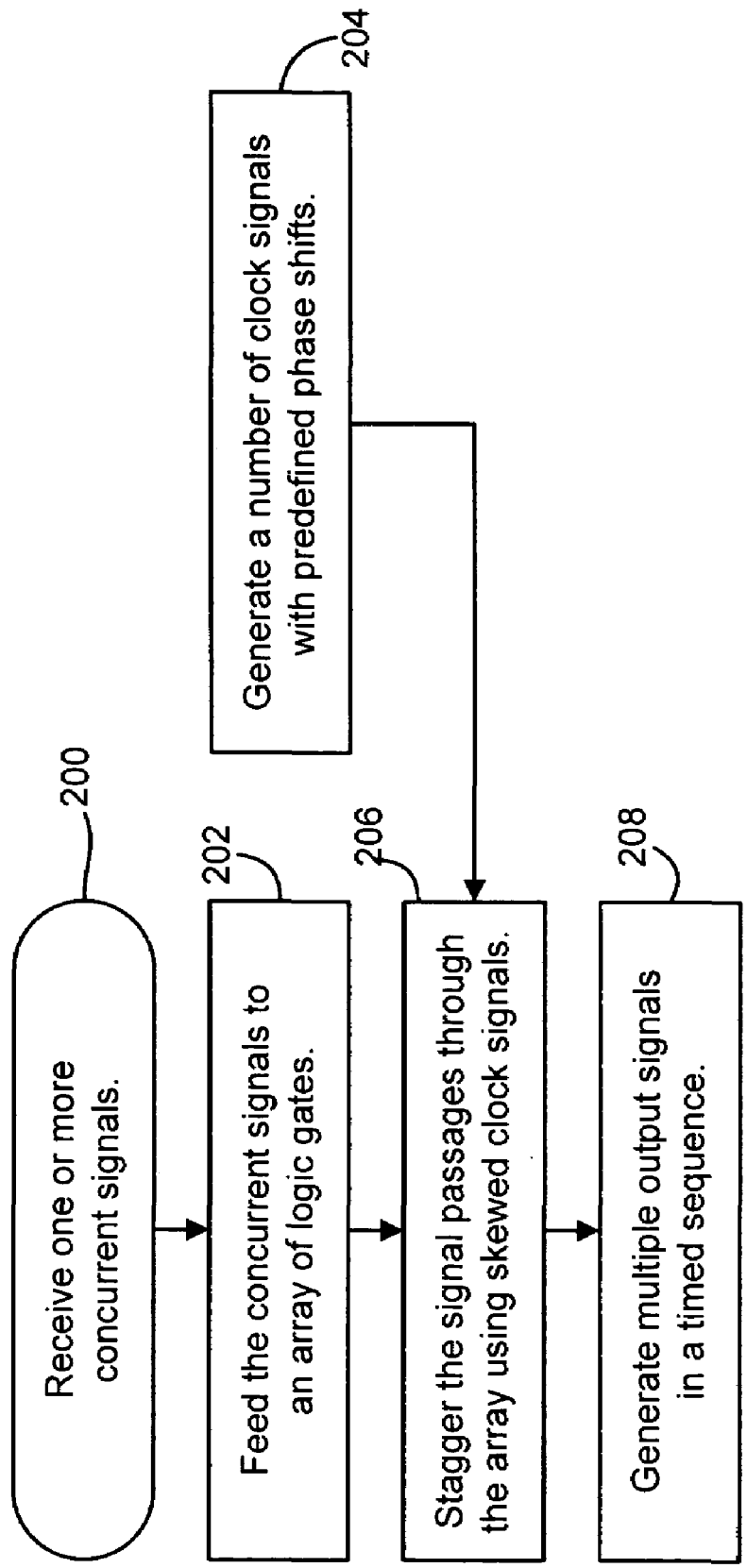
FIG. 2 is a flow chart illustrating an exemplary method for operating a delay circuit in accordance with an embodiment of the present disclosure.

Referring to FIG. 2, there is shown a flow chart illustrating an exemplary method for operating a delay circuit in accordance with an embodiment of the present disclosure.

In step 200, one or more substantially concurrent signals may be received. The one or more concurrent signals may be digital control signals associated with a memory array. For example, an ENABLE signal may be provided for transmission to a number of transmit systems that are part of a DRAM's I/O subsystem. Without any control, the ENABLE signal would be sent to the transmit systems simultaneously, causing a rapid current ramp on the power rail. To avoid such a rapid change in current, it may be desirable to control the delivery of the ENABLE signal in a non-simultaneous manner.

In step 202, the one or more substantially concurrent signals may be fed to an array of logic gates. The array of logic gates may include flip-flops and latches arranged in such a topology that they provide a number of data paths for the input signals. These flip-flops and latches may be clock-triggered or clock-synchronized components. An exemplary circuit topology is described below in connection with FIG. 3.

In step 204, independent of step 202, a number of clock signals may be generated. These clock signals may have a common frequency but have different predefined phase angles (i.e., "skewed"). The generation of these clock signals may be independent or based on an existing system clock.

In step 206, the skewed clock signals may be used to stagger the signal passages through the array. The one or more concurrent signals may be passed through a number of data paths each causing a different amount of delay. Therefore, in step 208, the array of logic gates may generate multiple output signals in a timed sequence. That is, originally concurrent or substantially concurrent signals may each be delayed to some extent and come out of the array one after another in a predetermined sequence. As a result, the signals will not cause an abrupt current increase, which ultimately leads to less inductive noise.

Figure 3:
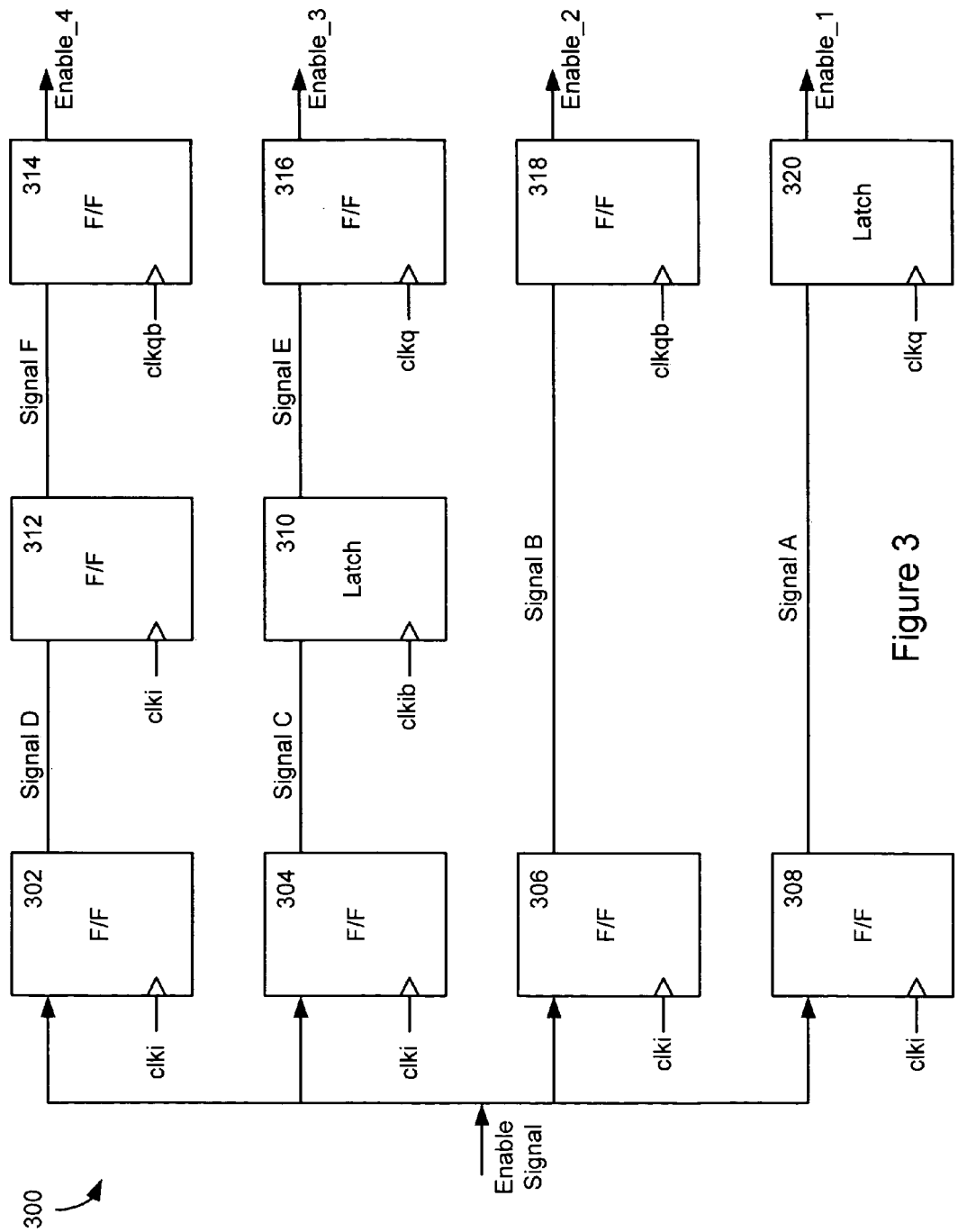
FIG. 3 is an exemplary delay circuitry in accordance with an embodiment of the present disclosure.

Referring to FIG. 3, there is shown an exemplary delay circuit 300 in accordance with an embodiment of the present disclosure. As shown in FIG. 3, an Enable Signal is passed through a number of flip-flops and latches to generate four output signals (i.e., "Enable_1," "Enable_2," "Enable_3," and "Enable_4"). The Enable Signal may be a control signal for the I/O subsystem of a DRAM.

Figure 4:
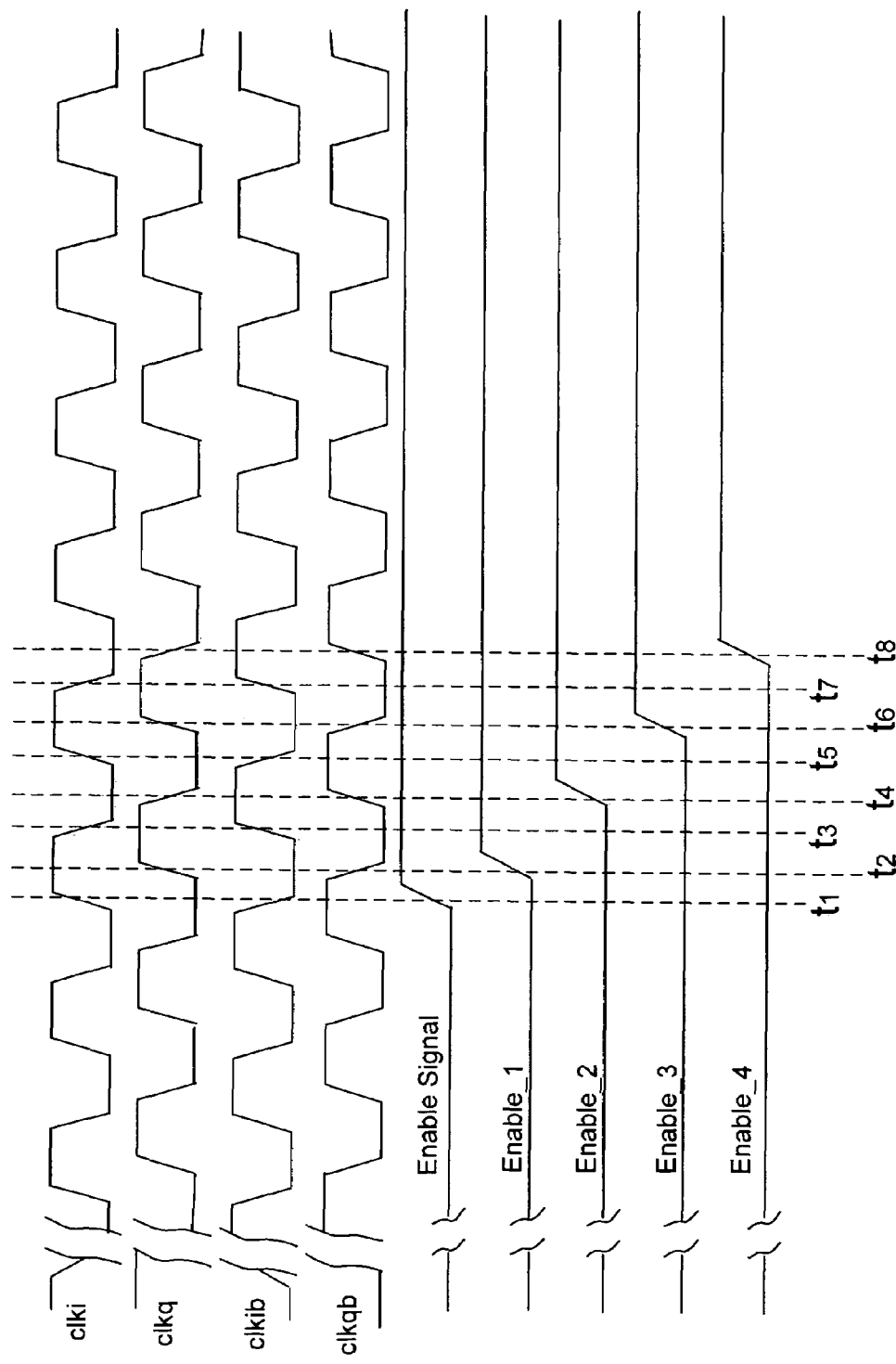
FIG. 4 is a waveform chart illustrating an operation of the exemplary circuitry for reducing inductive noise in accordance with an embodiment of the present disclosure.

A set of quadrature clock signals (i.e., "clki," "clkq," "clkib," and "clkqb") may be generated based on a much slower external clock. Exemplary waveforms for the quadrature clock signals are shown in FIG. 4. As shown, these quadrature clock signals may share a same frequency (e.g., 800 MHz) but have predefined phase shifts there between. For example, "clki" and "clkq" may be 90 degrees out of phase with each other, "clki" and "clkib" may be 180 degrees out of phase with each other, and "clki" and "clkqb" may be 270 degrees out of phase with each other. By using a phase-locked loop (PLL) circuit, the timing relationships among the quadrature clock signals can be held stable regardless of process, voltage or temperature variations. The quadrature clock signals may be used to control signal passages through the flip-flops and latches.

It should be appreciated that, although only flip-flops and latches are illustrated in FIG. 3, other types of delay circuits may also be used to effectuate the delays and stagger the signals. For example, the delay circuits may comprise one or more inverters, registers, flip-flops, other logic gates, and combinations thereof. The delay circuits may be clocked with an associated clocking circuitry.

FIG. 4 is a waveform chart illustrating an operation of the exemplary circuitry shown in FIG. 3. As mentioned above, the quadrature clock signals are shown in the upper half of FIG. 4. The waveforms for Enable Signal and four output signals are shown in the lower half of FIG. 4.

At time $t_1$, "clki" may trigger the Enable Signal to be passed through flip-flops 302, 304, 306 and 308, generating intermediate signals (i.e., Signal A, Signal B, Signal C, and Signal D). At time $t_2$, with the rising of "clkq," the latch 320 may open and pass Signal A, generating output signal Enable_1. At time $t_3$, with the rising of "clkib," the latch 310 may open and pass Signal C to generate an intermediate Signal E. At time $t_4$, with the rising of "clkqb," the flip-flop 318 may pass Signal B to generate output signal Enable_2. Then at time $t_5$, with the rising of "clki," the flip-flop 312 may pass Signal D to generate an intermediate Signal F. At time $t_6$, with the rising of "clkq," the flip-flop 316 may pass Signal E to generate output signal Enable_3. At time $t_8$, with the rising of "clkqb," the flip-flop 314 may pass Signal F to generate output signal Enable_4. As a result, the four output signals become available in a predetermined sequence spanning a time period that is 1.5 times the quadrature clock cycle. By staggering the four outputs, subsequent circuits, which are to receive the Enable Signal, may not experience a sudden current ramp and therefore would generate less inductive noise.

Figure 5:
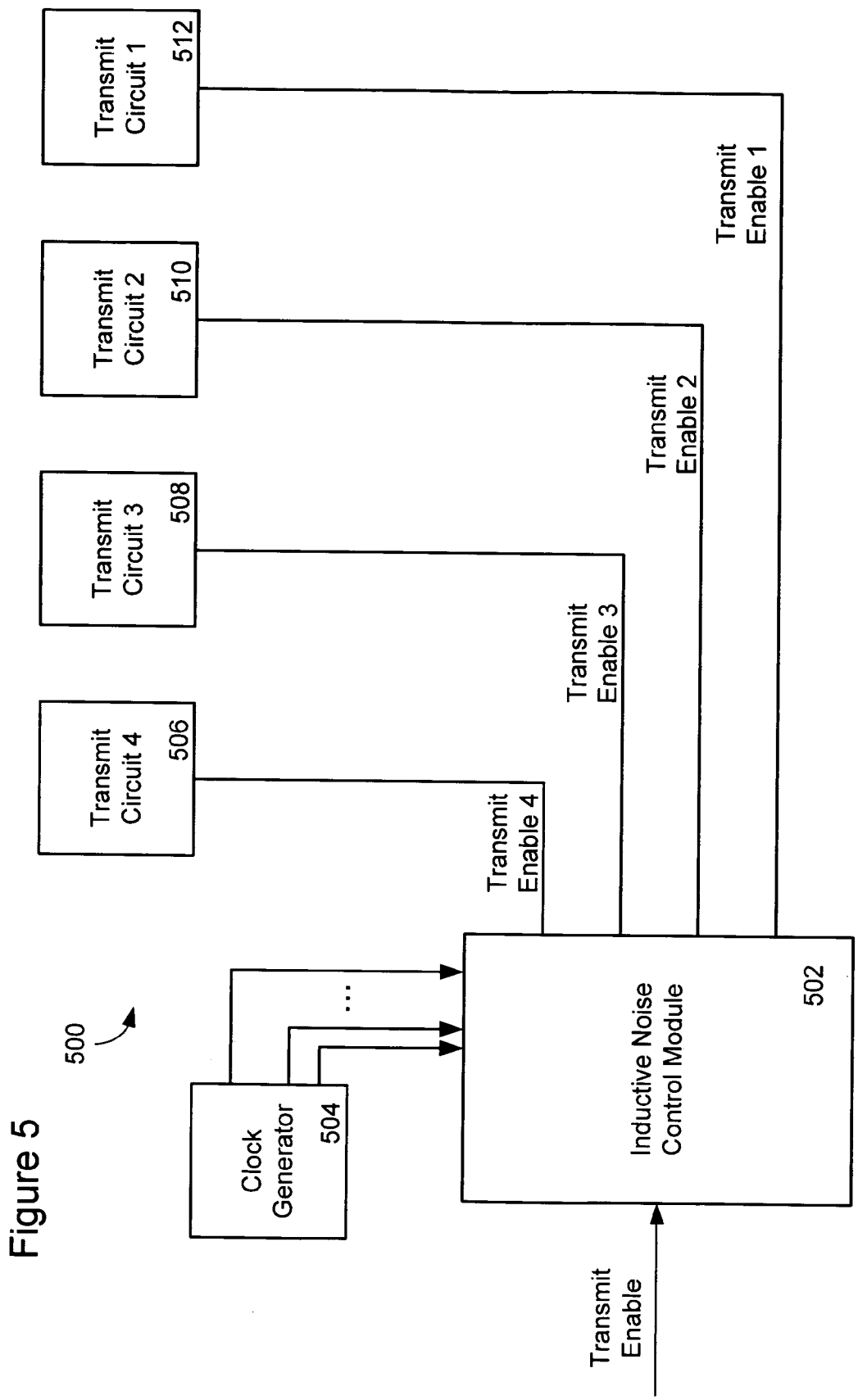
FIG. 5 is a block diagram illustrating an exemplary system incorporating a delay circuit in accordance with an embodiment of the present disclosure.

Referring now to FIG. 5, there is shown a block diagram illustrating an exemplary system 500 incorporating a delay circuit in accordance with an embodiment of the present disclosure. The system 500 may comprise an Inductive Noise Control Module 502, a Clock Generator 504, and a plurality of transmit circuits (506, 508, 510 and 512). The transmit circuits may be part of an output subsystem of a DRAM. The Inductive Noise Control Module 502 may comprise an array of logic gates such as flip-flops and/or latches that are controlled by a number of clock signals (e.g., quadrature clock signals) generated by the Clock Generator 504.

The exemplary system 500 depicted in FIG. 5 may be implemented to mitigate inductive noise problems for the transmit circuits. For example, instead of feeding a Transmit Enable signal to the four transmit circuits simultaneously, it may be input to the Inductive Noise Control Module 502. Synchronized and/or triggered by the well-defined clock signals generated in the Clock Generator 504, the logic gates in the Inductive Noise Control Module 502 may stagger the signal passages of the Transmit Enable signal. Four output signals (i.e., Transmit Enable 1 through 4) that are sequential in time may be generated and forwarded to the four transmit circuits respectively. As a result, the power rails accommodating the transmit circuits will not experience a large current ramp in a short time, which leads to less inductive noise.

Although the delay circuit 300 shown in FIG. 3 and the Inductive Noise Control Module 502 shown in FIG. 5 are controlled by clock signals, it should be appreciated that the goal of inductive noise control may be achieved without the use of clock signals. Instead, the delays required to stagger the signals may be generated based on resistor-capacitor (RC) delay elements or propagation gate delays.

At this point it should be noted that the technique for operating a delay circuit in accordance with the present disclosure as described above typically involves the processing of input data and the generation of output data to some extent. This input data processing and output data generation may be implemented in hardware or software. For example, specific electronic components may be employed in a memory or similar or related circuitry for implementing the functions associated with inductive noise reduction in accordance with the present disclosure as described above. Alternatively, one or more processors operating in accordance with stored instructions may implement one or more of the functions associated with inductive noise reduction in accordance with the present disclosure as described above. If such is the case, it is within the scope of the present disclosure that such instructions may be stored on one or more processor readable carriers (e.g., a magnetic disk), or transmitted to one or more processors via one or more signals.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the following appended claims. Further, although the present disclosure has been described herein in the context of a particular implementation in a particular environment for a particular purpose, those of ordinary skill in the art will recognize that its usefulness is not limited thereto and that the present disclosure can be beneficially implemented in any number of environments for any number of purposes. Accordingly, the claims set forth below should be construed in view of the full breadth and spirit of the present disclosure as described herein.

The invention claimed is:

1. An integrated circuit comprising:
    a delay circuit having a plurality of signal paths, wherein each of the plurality of signal paths delays an input signal to a different extent, thereby generating a plurality of staggered signals having the same transition characteristics as the input signal; and
    a plurality of transmit circuits that output a plurality of data bits in parallel based on the plurality of staggered signals.

2. The integrated circuit according to claim 1, wherein at least one of the plurality of signal paths in the delay circuit comprises at least one flip-flop.

3. The integrated circuit according to claim 1, wherein at least one of the plurality of signal paths in the delay circuit comprises at least one latch.

4. The integrated circuit according to claim 1, wherein at least one of the plurality of signal paths in the delay circuit comprises at least one resistor-capacitor (RC) delay element.

5. The integrated circuit according to claim 1, wherein at least part of the delay circuit is controlled by a plurality of clock signals.

6. The integrated circuit according to claim 5, wherein the plurality of clock signals have a common frequency but have different predefined phase angles.

7. The integrated circuit according to claim 6, wherein the plurality of clock signals comprise quadrature clock signals.

8. The integrated circuit according to claim 7, wherein the quadrature clock signals are generated based on an initial clock signal having a lower frequency than the common frequency.

9. The integrated circuit according to claim 1, wherein the input signal is an enable/disable signal associated with a memory device.

10. The integrated circuit according to claim 9, wherein the plurality of transmit circuits are associated with a respective plurality of input/output subsystems of the memory device.

11. A method for driving a plurality of circuits, the method comprising:
    processing an input signal in a delay circuit having a plurality of signal paths, wherein each of the plurality of signal paths delays the input signal to a different extent, thereby generating a plurality of staggered signals having the same transition characteristics as the input signal; and
    outputting a plurality of data bits in parallel based on the plurality of staggered signals.

12. The method according to claim 1, wherein at least one of the plurality of signal paths in the delay circuit comprises at least one flip-flop.

13. The method according to claim 11, wherein at least one of the plurality of signal paths in the delay circuit comprises at least one latch.

14. The method according to claim 11, wherein at least one of the plurality of signal paths in the delay circuit comprises at least one resistor-capacitor (RC) delay element.

15. The method according to claim 11, further comprising:
    controlling at least part of the delay circuit with a plurality of clock signals.

16. The method according to claim 15, wherein the plurality of clock signals have a common frequency but have different predefined phase angles.

17. The method according to claim 16, wherein the plurality of clock signals comprise quadrature clock signals.

18. The method according to claim 17, wherein the quadrature clock signals are generated based on an initial clock signal having a lower frequency than the common frequency.

19. The method according to claim 11, wherein the input signal is an enable/disable signal associated with a memory device.

20. The method according to claim 19, wherein the plurality of transmit circuits are associated with a respective plurality of input/output subsystems of the memory device.

21. An integrated circuit for reducing inductive noise in a system, the integrated circuit comprising:

input means for receiving an input signal that, if fed simultaneously to a plurality of I/O subsystems in the system, is capable of causing a first current ramp on power supply rails of the system;

delay circuit means for generating a plurality of staggered signals, wherein each of the plurality of staggered signals having the same transition characteristics as the input signal and is delayed to a different extent with respect to the input signal; and output means for outputting the plurality of staggered signals to the plurality of I/O subsystems respectively, thereby causing a second current ramp on the power supply rails of the system that is slower than the first current ramp.

22. An input/output (I/O) system comprising:

a plurality of I/O subsystems;

means for receiving an input signal that, if fed simultaneously to the plurality of I/O subsystems, is capable of causing a first current ramp on power supply rails of the I/O system;

means for generating a plurality of staggered signals, wherein each of the plurality of staggered signals having the same transition characteristics as the input signal and is delayed to a different extent with respect to the input signal; and means for outputting the plurality of staggered signals to the plurality of I/O subsystems respectively, thereby causing a second current ramp on the power supply rails of the I/O system that is slower than the first current ramp.

* * * * *